United States Patent
Sievers et al.

(10) Patent No.: US 8,008,209 B2
(45) Date of Patent: Aug. 30, 2011

(54) THERMAL GRADIENT CONTROL OF HIGH ASPECT RATIO ETCHING AND DEPOSITION PROCESSES

(75) Inventors: Michael R. Sievers, Poughkeepsie, NY (US); Kaushik A. Kumar, Beacon, NY (US); Andres F. Munoz, Yonkers, NY (US); Richard Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 979 days.

(21) Appl. No.: 11/877,965

(22) Filed: Oct. 24, 2007

(65) Prior Publication Data
US 2009/0107956 A1    Apr. 30, 2009

(51) Int. Cl.
*H01L 21/311* (2006.01)
*H01L 21/302* (2006.01)
*H01L 21/461* (2006.01)
*C03C 15/00* (2006.01)
*C03C 25/68* (2006.01)
*C23F 3/00* (2006.01)

(52) U.S. Cl. ........ 438/715; 438/701; 438/978; 438/719; 438/723; 438/735; 438/743; 216/67; 216/79; 216/80

(58) Field of Classification Search ........................ None
See application file for complete search history.

(56) References Cited

U.S. PATENT DOCUMENTS

| | | | | |
|---|---|---|---|---|
| 4,684,436 | A | * | 8/1987 | Burns et al. ............... 216/65 |
| 6,740,194 | B2 | | 5/2004 | Rushford et al. |
| 6,903,031 | B2 | * | 6/2005 | Karim et al. ............... 438/787 |
| 6,936,182 | B2 | | 8/2005 | Rushford |
| 2005/0118826 | A1 | * | 6/2005 | Boyd et al. ............... 438/699 |

* cited by examiner

*Primary Examiner* — Nadine Norton
*Assistant Examiner* — Stephanie Duclair
(74) *Attorney, Agent, or Firm* — Yuanmin Cai; Howard Cohn

(57) ABSTRACT

A technique is described whereby temperature gradients are created within a semiconductor wafer. Temperature sensitive etching and/or deposition processes are then employed. These temperature sensitive processes proceed at different rates in regions with different temperatures. To reduce pinch off in etching processes, a temperature sensitive etch process is selected and a temperature gradient is created between the surface and subsurface of a wafer such that the etching process proceeds more slowly at the surface than deeper in the wafer. This reduces "crusting" of solid reaction products at trench openings, thereby eliminating pinch off in many cases. Similar temperature-sensitive deposition processes can be employed to produce void-free high aspect ratio conductors and trench fills.

14 Claims, 4 Drawing Sheets

THERMAL GRADIENT CONTROL OF HIGH ASPECT RATIO ETCHING AND DEPOSITION PROCESSES

FIELD OF THE INVENTION

The present invention relates to the formation of structures in semiconductor devices, and more particularly to the formation of high aspect ratio structures by means of etching or deposition processes.

BACKGROUND OF THE INVENTION

The steady progress in semiconductor technology over the last several decades has been characterized largely by dramatic increases in circuit density. These increases have been made possible by corresponding improvements in semiconductor processing techniques for forming ever smaller geometric structures on semiconductor dies. These process improvements, however, involve much more than simple scaling of semiconductor and interconnect structures.

As semiconductor devices are scaled down in size, various practical physical limitations of the circuit elements and their interconnection structures are reached. These limits frequently require the semiconductor device designer to re-think the entire approach to the design of semiconductor circuit elements (e.g., transistors) in order to take full advantage of the smaller geometries made possible by improved processing techniques. This periodic "re-thinking" of semiconductor device design produces an ever-evolving landscape of transistor designs and circuit topologies.

Within any one generation of semiconductor device technology, it is frequently desirable to reduce the silicon "footprint" of a device and/or circuit. Io accomplish this without making fundamental changes to the design, it is common to create high-aspect ratio structures. For example, in order to shrink the width of a conductive line without reducing its current carrying capacity, it is necessary to make the conductive line taller. This requires a process capable of producing a high-aspect ratio structure.

High aspect-ratio lines are often formed by creating high aspect ratio trenches (skinny, deep trenches), then filling them with conductive material (e.g., polysilicon or metal). One well-known challenge in forming such structures is the problem of "pinch-off". In performing deep etches, a "crust" or "cusp" forms on the sidewalls of the trench being etched. If the trench is narrow enough (high aspect ratio), then as the reaction proceeds this crust can become thick enough to effectively close over or "pinch off" the top of the trench, thereby preventing etching reactants from migrating into the lower portions of the trench. This "pinch off" effect has a limiting effect on the aspect ratio of trench etches.

A similar pinch-off effect can occur when depositing material (e.g., conductive materials) into a trench. As the deposition proceeds, the deposited material accumulates disproportionately along the upper portions of the trench. If the trench is narrow enough, the material may close over or "pinch off" before the trench is completely filled, thereby forming a void in the deposited material. This has a limiting effect on the aspect ratio of deposited materials. In the case of conductors, such a void results in high resistance, which is antithetical to the purpose of creating a high aspect-ratio conductor in the first place.

Evidently, in order to continue shrinking semiconductor device footprints, it would be beneficial to have a method for producing high aspect ratio structures that reduces or eliminates the problem of "pinch off".

SUMMARY OF THE INVENTION

It is therefore an object of the present inventive technique to provide semiconductor etching and deposition techniques that reduce or eliminates the problem of pinch off.

The present inventive technique uses the temperature sensitivity of certain etching and deposition processes to create differential reaction rates. By creating thermal differentials within a semiconductor wafer and using thermally sensitive processes, reactions can proceed at different rates simultaneously on the same wafer, even within the same structure.

To reduce or eliminate pinch off, a thermally sensitive etching process is selected and a thermal gradient is created such that the temperature near the surface of the wafer (i.e., at the tops of the trenches being etched is different from the temperature away from the surface. The etching process is selected such that the reaction will proceed more slowly near the surface than lower in the wafer. By slowing the reaction near the surface, the buildup of solid reaction products ("crusting") near the tops of trenches being etched is substantially slowed, thereby delaying or eliminating pinch off. This greatly increases the aspect ratio of trenches that can be etched without risking pinch off.

The same technique can be applied to deposition, whereby the accumulation of the material being deposited in a (high aspect ratio) trench is slower near the top of the trench relative to the bottom of the trench. This prevents pinch off and thereby prevents void formation.

To produce temperature gradients, the bulk temperature of the wafer is controller by "conventional" means (chillers, heaters) and heating energy is applied locally to produce "hot spots". For example, to produce an elevated temperature near the surface of a wafer, pulsed laser energy can be applied, quickly heating the surface of the wafer relative to the remainder of the wafer. By controlling the pulse energy, pulse rate, and raster pattern scanned by the laser, the surface temperature can be locally elevated relative to the bulk wafer temperature.

According to an aspect of the invention, it is possible to "invert" the temperature profile and use pulsed laser energy to create "interior" temperatures that are higher than the surface temperature. In this scenario, the bulk temperature of the wafer is set in the same way.

Typically when forming trenches or depositing fills, the surface of a semiconductor wafer is oxide. Other materials, e.g., nitride, reside in lower layers of the wafer. By selecting a laser wavelength to which the surface material (e.g., oxide) is substantially transparent, but which is readily absorbed by underlying materials (e.g., nitride), pulsed laser energy applied to the wafer passes through the surface and is absorbed by the underlying materials, thereby causing localized heating "from the middle out". This produces a surface temperature that is lower than the temperature deeper in the wafer away from the surface.

Since it is possible to create temperature gradients that are either higher or lower at the surface, thermally sensitive reactions can be selected that proceed either faster or slower at elevated temperature, with the same effect. Further, the heating technique and temperature-sensitive reaction can he selected to proceed either faster or slower at the surface of the wafer, as desired.

According to an aspect of the invention, controlled undercuts can be created in a wafer by employing an etch process that proceeds faster away from the wafer surface (i.e., deeper in a trench being formed) than it does near the surface. By allowing the reaction to proceed, etching will continue faster at the bottom of a trench than at the top, eventually resulting in a controlled undercut.

The basic steps of the present inventive technique start with selecting a temperature sensitive reaction. The reaction rate can be either higher or lower at elevated temperatures, but it must be temperature sensitive such that it proceeds at a different rate at a first reaction temperature than it does at a second reaction temperature. The reaction can be an etching process (e.g., Chemical Oxide Removal) or a deposition process. The wafer temperature is controlled such that the surface temperature of the wafer is different from the temperature away. The desired reaction profile (e.g., faster or slower at the surface) and the temperature sensitive characteristics of the reaction determine whether the surface temperature of the wafer is higher than the "interior" temperature away from the surface or vice versa. Accordingly, the surface temperature can be substantially equal to the first reaction temperature or to the second reaction temperature, with the temperature away from the surface being maintained near either the second reaction temperature or the first reaction temperature, accordingly.

The selected reaction is then allowed to proceed with the temperature differential in place, thereby causing different reaction rates at the surface and deeper in the wafer.

According to an aspect of the invention, the present inventive technique can be applied to an etching process to produce a high aspect ratio trench, or to a deposition process to produce a void-free high aspect ratio trench fill (e.g., a high aspect ratio conductive line).

Other objects, features and advantages of the inventive technique will become evident in light of the ensuing description thereof.

BRIEF DESCRIPTION OF THE DRAWINGS

These and further features of the present invention will be apparent with reference to the following description and drawing, wherein.

DETAILED DESCRIPTION OF THE INVENTION

The present inventive technique makes use of the fact that the rates of certain etching and deposition processes are significantly affected by temperature. By creating temperature differentials in a semiconductor wafer, (e.g., at different depths in a trench) etching and/or deposition can be caused to occur at different rates simultaneously at different locations on the wafer.

By controlling temperature such that an etch rate is higher at the bottom of a trench than at the top, the rate at which solid reaction products (the aforementioned "crust") form along the upper sidewalls of the trench can be reduced, thereby eliminating or at least delaying pinch off.

By way of example, a two-step Chemical Oxide Removal process is shown to be temperature-sensitive. The first step is characterized a reaction between a mixture of gaseous hydrofluoric acid and gaseous ammonia with oxide (silicon dioxide—$SiO_2$) on the surface of a wafer, leaving behind a solid reaction product on the surface. The second step is characterized by evaporation of the solid reaction product by the application of heat to the wafer.

When removing (etching) silicon dioxide from the surface of a silicon wafer using gaseous reactants in this manner, the process passivates the silicon in much the same way as aqueous removal of silicon dioxide from silicon using hydrofluoric acid.

This two-step Chemical Oxide Removal process (hereinafter COR) is further shown and described hereinbelow with respect to FIGS. 1A and 1B.

Figure 1A:
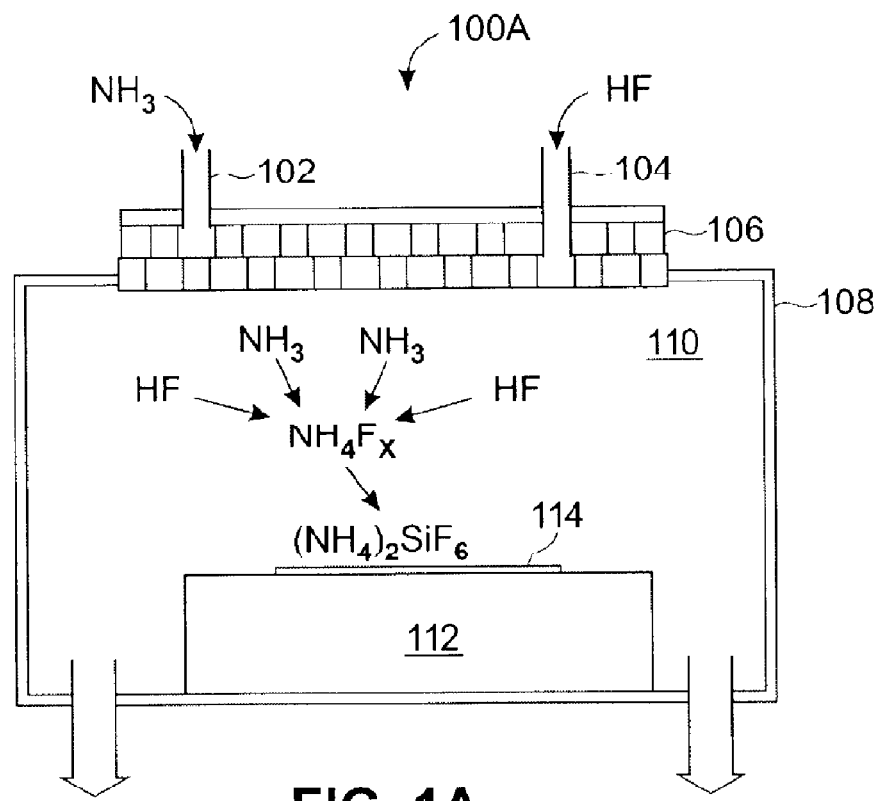
FIGS. 1A and 1B are diagrams of a chemical oxide removal (COR) process.

FIG. 1A shows apparatus 100A for performing a first part of a Chemical Oxide Removal process (hereinafter COR). A semiconductor wafer 114 is disposed atop a chiller 112 in a first reaction chamber 108. Gaseous ammonia ($NH_3$) and hydrofluoric acid (HF) are introduced via inlet ports 102 and 104, respectively into a reaction area 110 of the chamber 108 through a mixer 106. Preferably, a inert gaseous carrier (e.g., Argon) transports the reactants through the reaction area 110. Preferably, the wafer has been previously prepared for patterned oxide removal (e.g., by masking with a photo-resist or other suitable means of patterning). The chiller 112 controls the temperature of the wafer 114, preferably between 10 and 30 degrees Celsius. In the reaction area 110, the $NH_3$ and HF combine to form $NH_4F_x$, which further reacts to etch away exposed oxide on the surface of the wafer 114 (surface microetch), leaving behind a solid reaction product $(NH_4)_2SiF_6$.

Figure 1B:
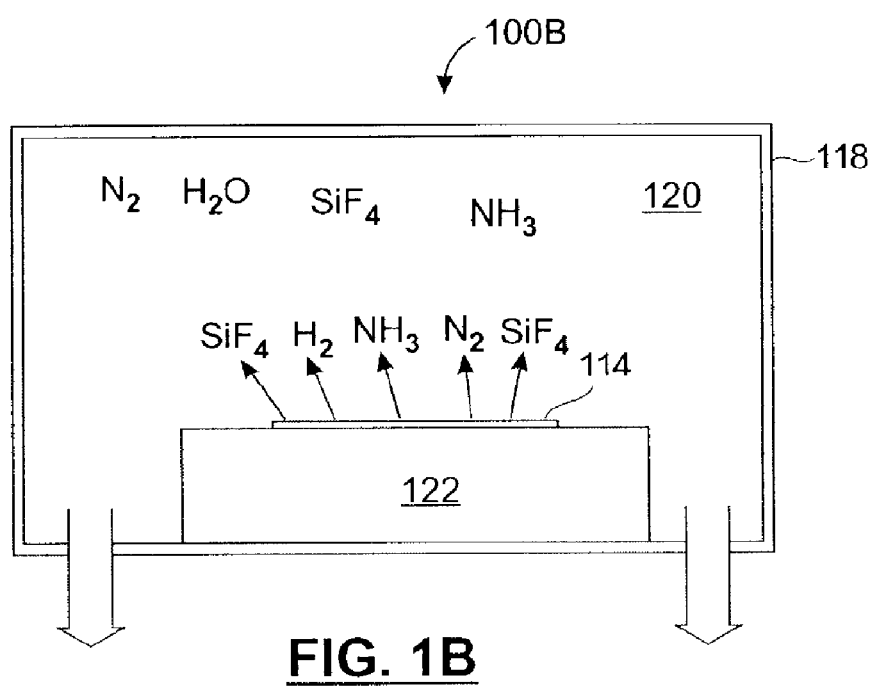

FIG. 1B shows apparatus 100B for performing a second part of the COR process. After etching, the semiconductor wafer 114 is disposed on a heater 122 in a reaction area 120 of a second reaction chamber 118, where it is heated (preferably between 100 and 200 degrees Celsius) to drive off the solid reaction product produced in the etching process described hereinabove with respect to FIG. 1A. Heating causes the solid reaction product $(NH_4)_2SiF_6$ to be driven off as $SiF_4$, $NH_3$, $N_2$ and $H_2$, also producing $H_2O$ vapor in the reaction area 120.

Figure 2:
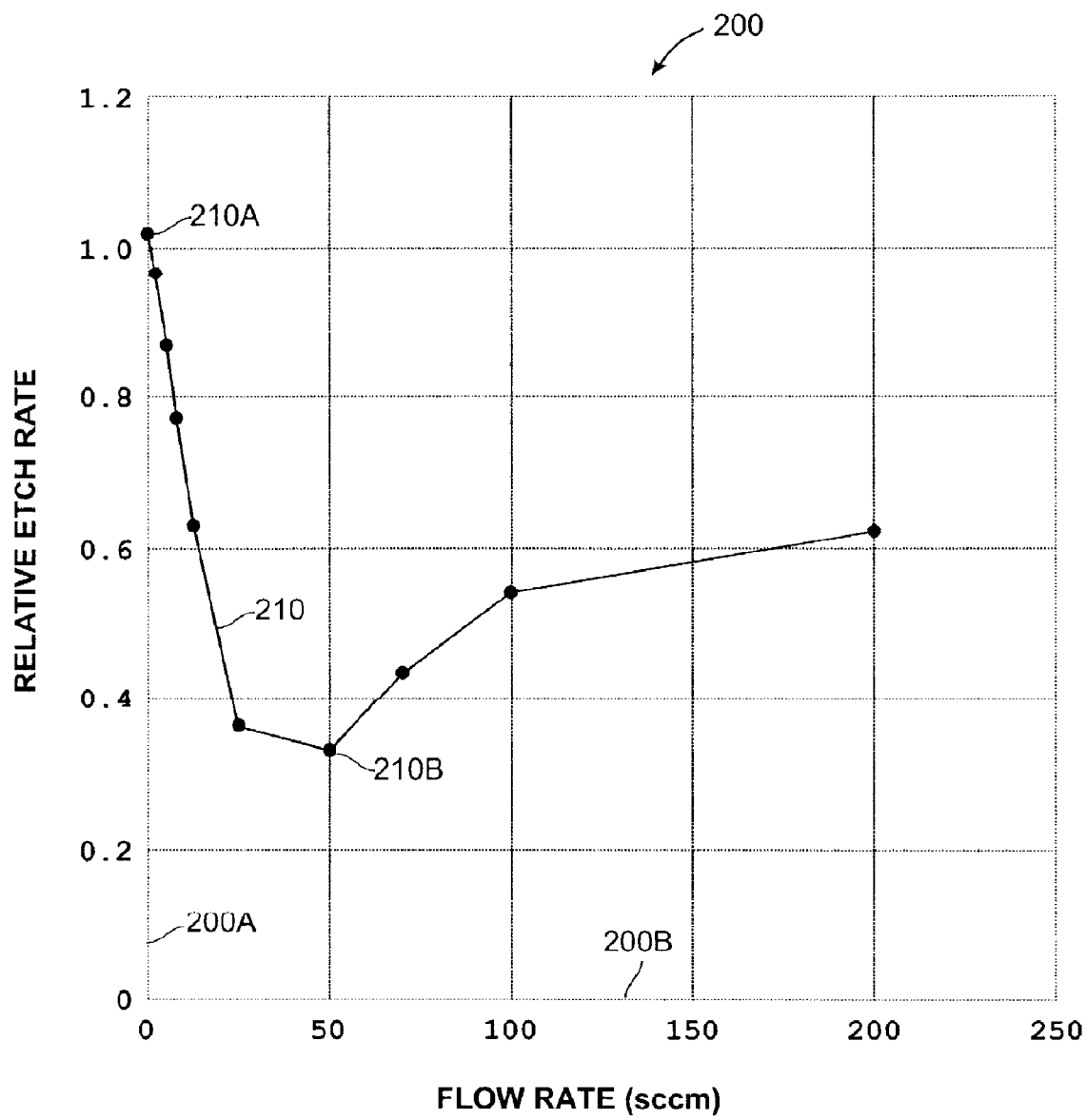
FIG. 2 is a graph that plots the relative reaction rate of the chemical oxide removal process of FIG. 1A at two different temperatures against the flow rate of reactants.

FIG. 2 is a graph 200 that plots the ratio of the COR etch rates at 24.5 degrees Celsius and 19.6 degrees Celsius (on the (on the vertical axis 200A) as the Argon flow rate in the first reaction chamber 108 (on the horizontal axis 200b) is varied. The resultant curve 210 indicates how much difference can be expected between the reaction rate at 24.5 degrees and the reaction rate at 19.6 degrees for any given rate of Argon flow (i.e., reactant flow—as stated previously, Argon acts as a carrier for the reactants.) At the point 210A where there is zero flow in the chamber, the reaction rates are nearly equal at the two temperatures, and the ratio plotted is approximately 1.0. However, at an Argon flow rate of 50 sccm, the reaction rate at 24.5 degrees is about one third of same reaction at 19.6 degrees, as indicated by the corresponding plot point 210B.

To take advantage of this reaction rate difference, the present inventive technique creates localized heating in the wafer such that the COR process proceeds about three times more slowly where the local wafer temperature is close to 24.5 degrees than it does where the local wafer temperature is close to 19.6 degrees.

One suitable technique for creating localized heating is the application of pulsed laser energy to the wafer surface. By controlling the laser's pulse energy, wavelength, pulse duration, raster pattern (in scanning over the wafer) and pulse repetition rate, the localized surface temperature of the wafer can be rapidly raised relative to the rest of the wafer. If a chiller is used to maintain the overall wafer temperature at a relatively lower temperature (e.g., 19.6 degrees), then pulsed laser energy can applied to the surface of the wafer to raise just the surface of the wafer to a relatively higher temperature (e.g., 24.5 degrees).

Figure 3A:
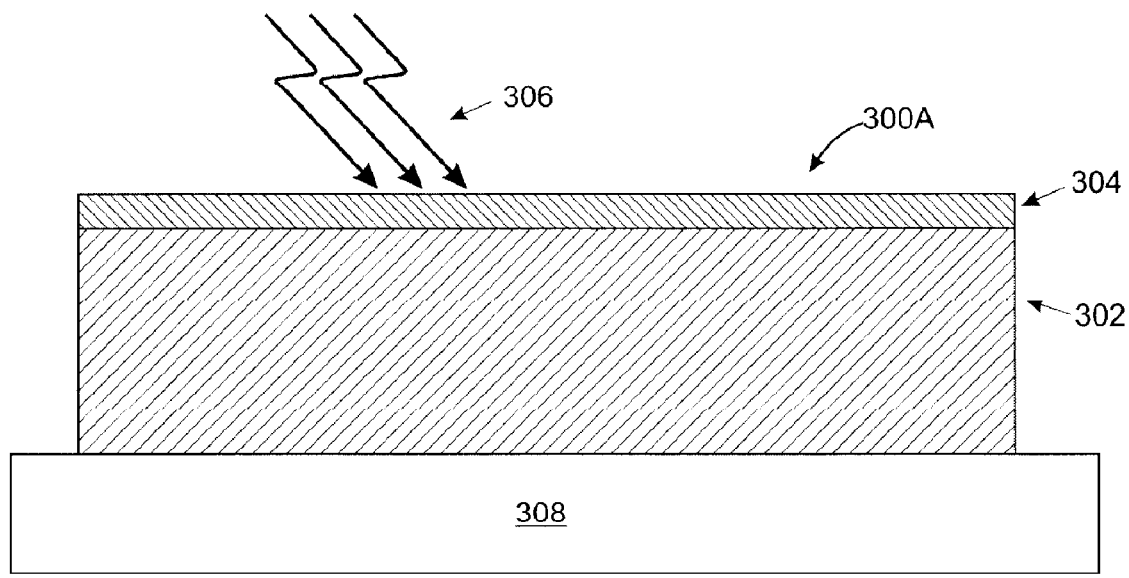
FIGS. 3A and 3B are views of a silicon wafer being subjected to pulsed laser heating to create a thermal gradient, in accordance with the invention.

This is illustrated in FIG. 3A, wherein a wafer 300A is subjected to pulsed laser energy (depicted by lines 306) to produce a high-temperature surface region 304 compared to a relatively lower-temperature substrate 302. Backside cooling by a chiller 308 maintains the (lower) substrate temperature.

The technique described with respect to FIG. 3A works well when an elevated surface temperature is desired. It is also possible, however, using a similar pulsed laser technique to produce an "inverted" temperature profile wherein temperatures deeper in the wafer can be elevated relative to the surface temperature. This can be accomplished by selecting a laser wavelength to which the surface of the wafer (e.g., surface oxide) is substantially transparent, but which materials (e.g., nitride) deeper in the wafer readily absorb.

Figure 3B:
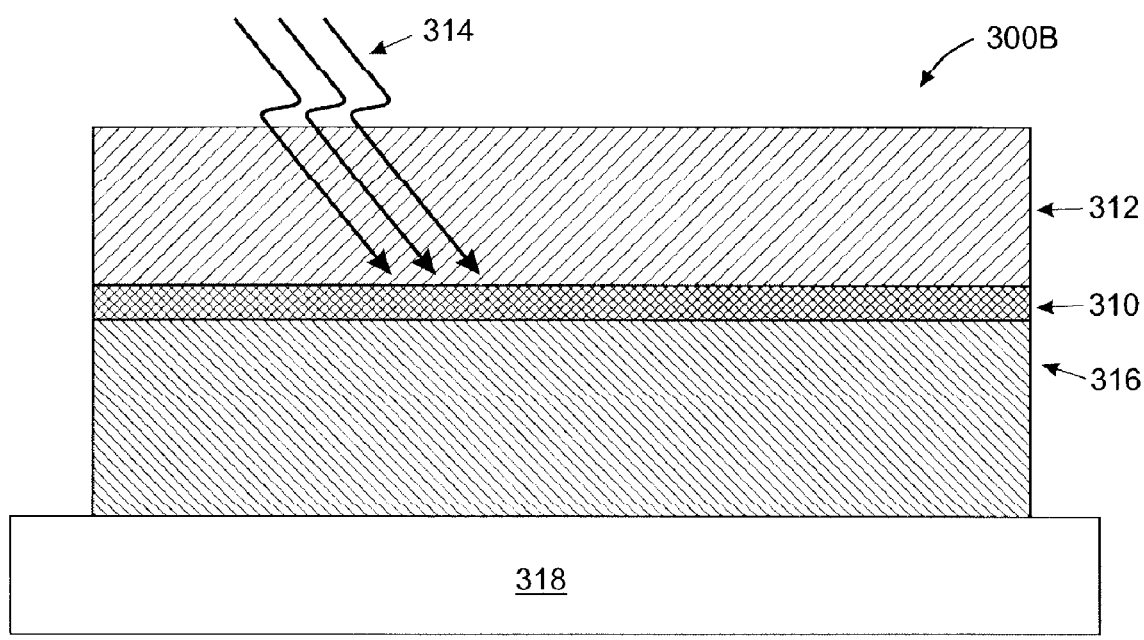

This technique for producing an "inverted" temperature gradient is now shown and described with respect to FIG. 3B, wherein a silicon wafer 300B is subjected to pulsed laser energy (depicted by lines 314). The wavelength of the laser energy is selected such that an upper layer 312 is substantially transparent to the laser, but a lower layer 316 readily absorbs the laser energy, producing a localized elevated temperature region 310 at the interface between the upper layer 312 and the lower layer 316. Effectively, the wafer 300B is heated "from the middle", resulting in temperatures at the surface of the wafer 300B that are lower than temperatures deeper therein. In a manner similar to that shown and described hereinabove with respect to FIG. 3A, a chiller 318 provides backside cooling of the wafer 300B to maintain the bulk temperature thereof. The pulsed laser energy 314 provides only localized heating for the purpose of controlling reaction rates.

Figure 4A:
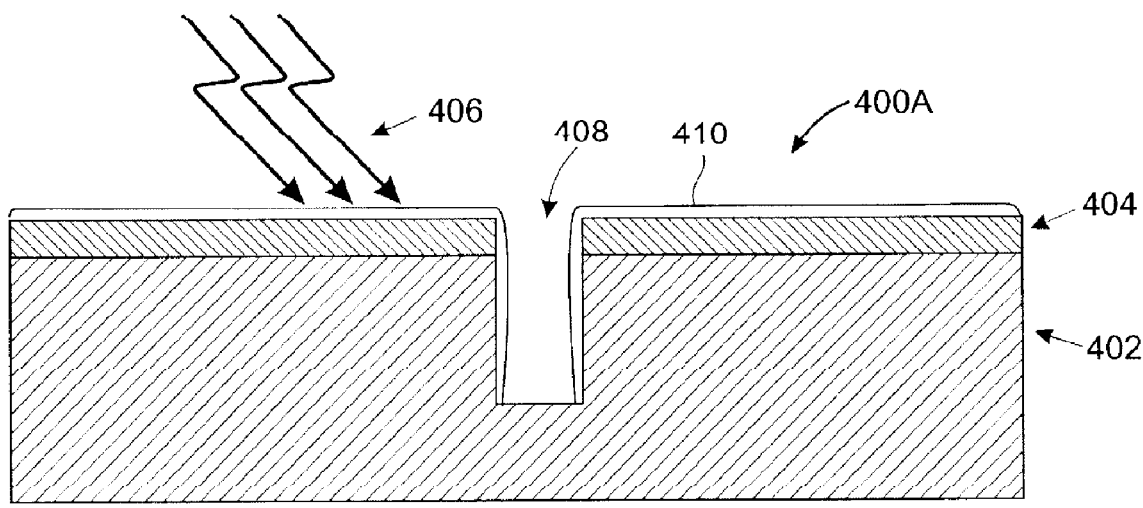
FIG. 4A is a view of a silicon wafer wherein a high-aspect ratio trench is formed in accordance with the invention.

FIG. 4A illustrates the use of the present inventive technique to minimize pinch-off in etching high aspect-ratio trenches. In FIG. 4A, a wafer 400A is etched by a COR process to etch a high aspect ratio trench 408 into an oxide surface 402 thereon. The COR process is temperature sensitive such that with the selected reactants the etch rate is slower at a first, higher temperature than it is at a second, lower temperature. Pulsed laser energy 406 is applied to create an elevated temperature region 404 close to said first temperature at the top of the trench 408. Backside chilling (sec FIGS. 3A, 3B) maintains lower portions of the trench close to said second temperature. This produces a temperature differential between the upper and lower sidewalls of the trench 408. Due to the temperature differential as the reaction proceeds, solid reaction product 410 builds up more slowly along the upper sidewalls of the trench 408 than it would otherwise, thereby preventing pinch-off.

Another aspect of the invention made possible by differential etch rates is the ability to create controlled undercuts, e.g., forming trenches where the bottom of the trench is wider than the top. This is shown and described with respect to FIG. 4B.

Figure 4B:
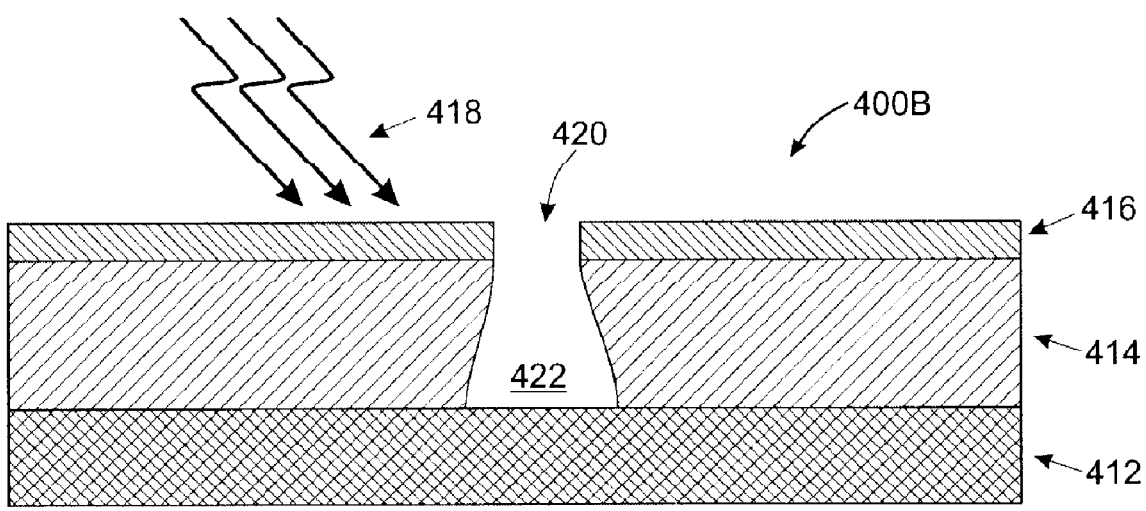
FIG. 4B is a view of a silicon wafer wherein a high-aspect ratio trench has been formed with a controlled undercut, in accordance with the invention.

FIG. 4B illustrates the use of the present inventive technique to produce an "undercut" in the form of a trench that is wider at the bottom than it is at the top. In FIG. 4B, a wafer 400B is etched by a COR process to produce a trench 420 in oxide 414, stopping at base layer 412. The COR process is temperature sensitive such that with the selected reactants, the etch rate is significantly slower at a first, higher temperature than it is at a second, lower temperature. Pulsed laser energy 418 is applied to create an elevated temperature region 416 close to said first temperature at the top of the trench 420. Backside chilling (sec FIGS. 3A, 3B) maintains lower portions of the trench close to said second temperature. This produces a temperature differential between the upper and lower sidewalls of the trench 420. Because of the difference in reaction rates, etching in lower portions 422 of the trench 420 proceed at a much faster rate than nearer to the surface of the wafer (which is at an elevated temperature), thereby permitting the etch process to extend further laterally in the lower portion 422 of the trench 422 than at the top, thus producing an undercut. By carefully controlling the temperature differential, timing, and reactants, this undercut can be produced reliably and repeatably.

Although the present inventive technique has been described hereinabove with respect to a COR etch process and pulsed laser energy, it is equally applicable to any etch or deposition process which has q significantly different reaction rate at different temperatures. Since the present inventive technique explicitly provides for temperature profiles that can be either higher or lower at the surface of the wafer than deeper in the wafer, the present inventive technique is equally applicable to etch and/or deposition processes that proceed slower at elevated temperatures or faster at elevated temperatures. It is fully within the spirit and scope of the present invention to apply the present inventive technique to any such type of temperature-sensitive reaction.

By way of example, the profiles of features created by RIE (Reactive Ion Etch) can be altered (i.e., improved or controlled) by controlling localized temperature gradients within the wafer during RIE processing.

By way of further example, pinch off in deposition processes can be minimized or eliminated in much the same way as pinch off is eliminated in etching processes (see FIG. 4A). By selecting a temperature sensitive deposition process and controlling local temperatures within a wafer such that the deposition reaction proceeds more slowly along upper sidewalls of a trench than along lower sidewalls thereof, pinch off can be minimized or eliminated. In effect the build-up of the deposited material is treated in exactly the same way as "crust" formation (build-up of solid reaction products) in the previously described etching process. By slowing down the deposition rate at the upper portion of the trench, the trench can be completely filled, avoiding pinch off and preventing void formation.

Further, the present inventive technique has been described in terms of processes that minimize reaction rates near the surface of a wafer relative to the reaction rates deeper in the wafer. The present inventive technique, however, anticipates that it may be desirable instead to maximize to maximize reaction rates near the surface of a wafer. This is easily accomplished by inverting the temperature profile (see FIG. 3B). It is fully within the spirit and scope of the present invention to do so.

The discussion hereinabove with respect to the present inventive technique describes application of heat by means of pulsed laser energy. This is intended to he merely exemplary of methods for producing localized heating. Any suitable method of producing localized "hot spots" (e.g., focused non-laser light, electrical heating via embedded resistive elements, etc.) is fully within the spirit and scope of the present inventive technique.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described inventive components the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. A method of forming high aspect ratio structures in a semiconductor wafer, comprising the steps of:
    selecting a temperature sensitive reaction such that the reaction rate thereof is significantly higher at a first reaction temperature than at a second reaction temperature;
    controlling the temperature in the interior of a semiconductor wafer to be close to a first predetermined temperature;
    controlling the temperature of an upper surface of the semiconductor to be close to a second predetermined temperature;
    performing the selected reaction on the wafer such that the reaction proceeds at a different rate near the upper surface of the wafer near the second predetermined temperature than in the interior of the wafer near the first predetermined temperature;
wherein the step of controlling the temperature in the interior of a semiconductor wafer comprises the steps of:
    selecting a laser wavelength to which the surface of the wafer is substantially transparent and which is easily absorbed by materials in the interior of the wafer; and
    applying pulsed laser energy at the selected wavelength to the wafer to produce localized heating in the interior of the wafer.

2. A method according to claim 1, wherein:
the first reaction temperature is higher than the second reaction temperature.

3. A method according to claim 1, wherein:
the first predetermined temperature is substantially equal to the first reaction temperature and the second predetermined temperature is substantially equal to the second reaction temperature.

4. A method according to claim 1, wherein:
the selected reaction is an etching process.

5. A method according to claim 1, wherein:
the high aspect ratio structure is a trench.

6. A method according to claim 5, wherein:
the selected reaction is a Chemical Oxide Removal process.

7. A method according to claim 1, wherein:
the selected reaction is a deposition process.

8. A method according to claim 7, wherein:
the high aspect ratio structure is a trench fill.

9. A method according to claim 1, wherein:
the reaction near the surface of the wafer near the second predetermined temperature proceeds slower than the reaction rate in the interior of the wafer near the first predetermined temperature.

10. A method of producing controlled undercuts in a semiconductor wafer, comprising the steps of:
    selecting a temperature sensitive etch reaction such that the reaction rate thereof is significantly higher at a first reaction temperature than at a second reaction temperature;
    controlling the temperature in the interior of a semiconductor wafer to be close to the first reaction temperature;
    controlling the temperature of an upper surface of the semiconductor wafer to be close to the second reaction temperature;
    performing the selected etch reaction on the wafer such that the reaction proceeds at a substantially slower rate near the upper surface of the wafer near the second predetermined temperature than in the interior of the wafer near the first predetermined temperature to form an undercut.

11. A method according to claim 10, wherein:
the first reaction temperature is higher than the second reaction temperature.

12. A method according to claim 10, wherein:
the first reaction temperature is lower than the second reaction temperature.

13. A method according to claim 10, wherein the step of controlling the temperature of the upper surface of the wafer further comprises the step of applying pulsed laser energy to the upper surface of the wafer.

14. A method according to claim 10, wherein the step of controlling the temperature in the interior of the wafer further comprises the steps of:
    selecting a laser wavelength to which the surface of the wafer is substantially transparent and which is easily absorbed by materials in the interior of the water; and
    applying pulsed laser energy having the selected wavelength to the wafer to produce localized heating in the interior of the wafer.

* * * * *